United States Patent
Liaw

(10) Patent No.: US 10,950,605 B2
(45) Date of Patent: Mar. 16, 2021

(54) SEMICONDUCTOR DEVICE

(71) Applicant: TAIWAN SEMICONDUCTOR MANUFACTURING CO., LTD., Hsinchu (TW)

(72) Inventor: Jhon-Jhy Liaw, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/492,059

(22) Filed: Apr. 20, 2017

(65) Prior Publication Data
US 2018/0277542 A1    Sep. 27, 2018

Related U.S. Application Data

(60) Provisional application No. 62/475,914, filed on Mar. 24, 2017.

(51) Int. Cl.
 *H01L 27/092* (2006.01)
 *H01L 29/78* (2006.01)
 *H01L 29/417* (2006.01)

(52) U.S. Cl.
 CPC .... *H01L 27/0924* (2013.01); *H01L 29/41791* (2013.01); *H01L 29/785* (2013.01)

(58) Field of Classification Search
 CPC ............... H01L 27/0924; H01L 23/535; H01L 29/41725
 See application file for complete search history.

(56) References Cited

U.S. PATENT DOCUMENTS

| | | | |
|---|---|---|---|
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 9,105,490 B2 | 8/2015 | Wang et al. | |
| 9,236,267 B2 | 1/2016 | De et al. | |
| 9,236,300 B2 | 1/2016 | Liaw | |
| 9,520,482 B1 | 12/2016 | Chang et al. | |
| 9,576,814 B2 | 2/2017 | Wu et al. | |
| 2006/0273385 A1* | 12/2006 | Hshieh | H01L 24/83 257/330 |
| 2007/0235765 A1* | 10/2007 | Liaw | H01L 27/11 257/207 |
| 2008/0116496 A1* | 5/2008 | Tzeng | H01L 27/105 257/296 |
| 2012/0132986 A1* | 5/2012 | Kang | H01L 21/823487 257/329 |
| 2014/0153321 A1* | 6/2014 | Liaw | G11C 11/412 365/154 |
| 2015/0035023 A1* | 2/2015 | Kim | H01L 29/6681 257/288 |

* cited by examiner

*Primary Examiner* — Timor Karimy
(74) *Attorney, Agent, or Firm* — McClure, Qualey & Rodack, LLP

(57) ABSTRACT

A semiconductor device includes a first transistor. The first transistor includes a first terminal, a first contact, a second terminal, and a second contact. The first contact is electrically connected to the first terminal, and the shape of the first contact is circular. The second contact is electrically connected to the second terminal and a ground terminal, and the shape of the second contact is rectangular.

20 Claims, 10 Drawing Sheets

US 10,950,605 B2

SEMICONDUCTOR DEVICE

RELATED APPLICATIONS

This application claims priority to U.S. Provisional Application Ser. No. 62/475,914, filed Mar. 24, 2017, which is herein incorporated by reference.

BACKGROUND

With the advance of science and technology, a semiconductor device becomes more and more small. The gate pitch (spacing) in the semiconductor devices is continuous shrunk and therefore induced contact to gate bridge concern. Fin field effect transistors (FinFET) required narrow fin width for short channel control and therefore resulted smaller top S/D regions than planar transistors. This will further degrade the contact to S/D landing margin and contact resistance. To solve this issue, the longer contact layout was proposed for 32 nm and beyond technologies. But area impact and worse gate to contact capacitance are major concerns.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 2:
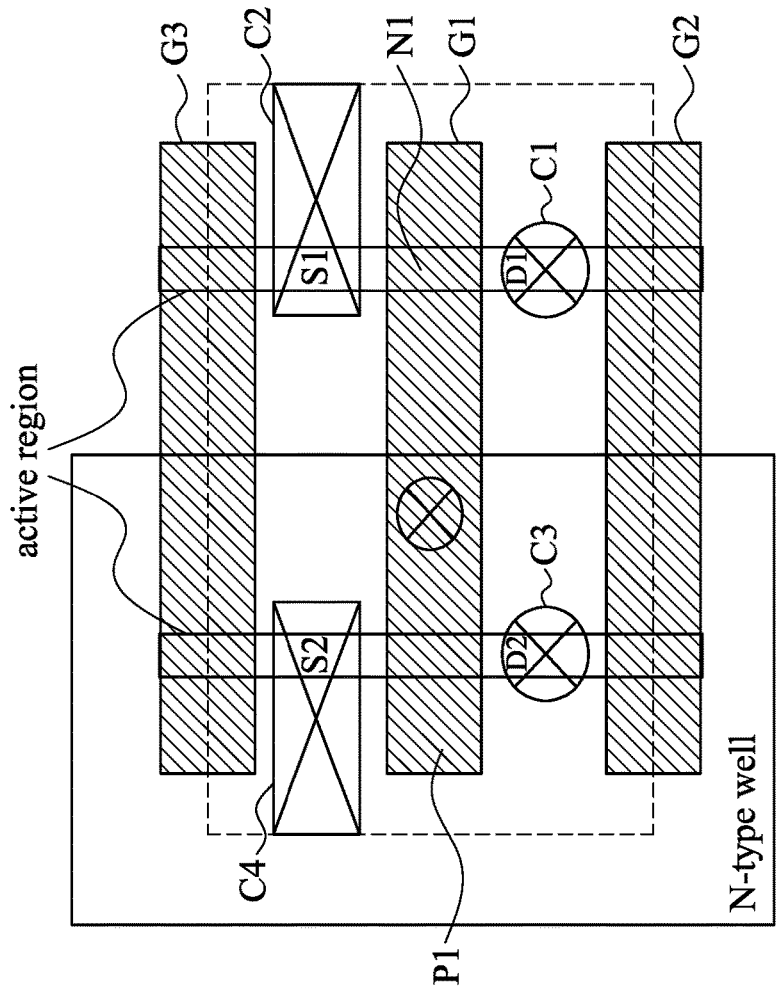
FIG. 2 is a top view of the semiconductor device in FIG. 1, in accordance with various embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

To continue shrink both STD cell (i.e., an inverter, a NAND, a NOR circuit) and static random-access memory (SRAM) cell and have better cell performance, the present disclosure proposed contact structures to have both lower source node contact resistance as well as low capacitance on drain node (or cell bit line node) to meet both high density and high speed system-on-chip (SOC) product requirements, which is described below.

Figure 1:
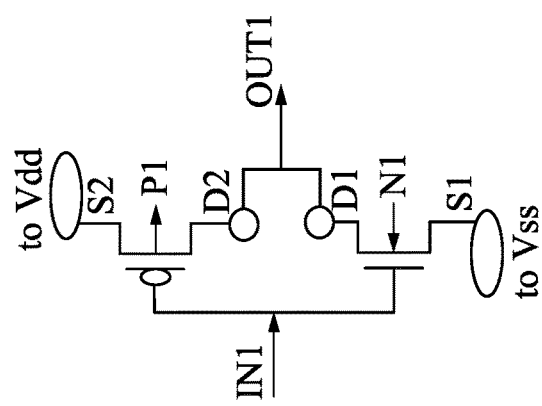
FIG. 1 is a diagram of a semiconductor device, in accordance with various embodiments.

Reference is now made to FIGS. 1 and 2. FIG. 1 is a diagram of a semiconductor device, in accordance with various embodiments. FIG. 2 is a top view of the semiconductor device in FIG. 1, in accordance with various embodiments. As illustrated in both FIGS. 1 and 2, the semiconductor device includes a first transistor N1 and a second transistor P1. The first transistor N1 includes a first terminal D1, a first contact C1, a second terminal S1, and a second contact C2. The first contact C1 is electrically connected to the first terminal D1, and the shape of the first contact C1 is circular. The second contact C2 is electrically connected to the second terminal S1 and a ground terminal Vss, and the shape of the second contact C2 is rectangular. However, the scope of the disclosure is not intended to be limited in the shape of the contacts, and other suitable shapes of the contacts are within the contemplated scope of the present disclosure. In some embodiments, the first contact C1 is directly connected to the first terminal D1 of the first transistor N1, and the second contact C2 is directly connected to the second terminal S1 of the first transistor N1.

As illustrated in both FIGS. 1 and 2, the second transistor P1 includes a first terminal D2, a first contact C3, a second terminal S2, a second contact C4, and a control terminal. The first contact C3 is electrically connected to the first terminal D2, and the shape of the first contact C3 is circular. The second contact C4 is electrically connected to the second terminal S2 and a power source Vdd, and the shape of the second contact C4 is rectangular. However, the scope of the disclosure is not intended to be limited in the shape of the contacts, and other suitable shapes of the contacts are within the contemplated scope of the present disclosure. In various embodiments, the control terminal of the second transistor P1 is electrically connected to a control terminal of the first transistor N1. In some embodiments, the semiconductor device in FIGS. 1~2 is, for example, a Complementary Metal-Oxide-Semiconductor (CMOS). In various embodiments, the first contact C3 is directly connected to the first terminal D2 of the second transistor P1, and the second contact C4 is directly connected to the second terminal S2 of the second transistor P1.

In various embodiments, the first transistor N1 and the second transistor P1 are, for example, single fin-line fin field effect transistors (FET). The first transistor N1 is, for example, single fin-line N-type FinFET, and the second transistor P1 is, for example, single fin-line P-type FinFET. In some embodiments, the first terminal D1 of the first transistor N1 and the first terminal D2 of the second transistor P1 are drains. The second terminal S1 of the first transistor N1 and the second terminal S2 of the second transistor P1 are sources. In some embodiments, the source and the drain of the P-type FinFET P1 comprise epi profile selected from the group consisting of SiGe, SiGeC, Ge, Si, and combinations thereof. In various embodiments, the source and the drain of the N-type FinFET N1 comprises epi profile selected from the group consisting of SiP content, SiC content, SiPC, SiAs, Si, and combinations thereof. In some embodiments, the transistors are FinFET structure and selected from the group consisting of 2D-finFET structure, 3D-finFET structure, and combinations thereof. In various embodiments, the structure of the gate electrodes in FIGS. 1 and 2 comprise multiple material structure selected from the group consisting of poly gate/SiON structure, metals/high-K dielectric structure, Al/refractory metals/high-K dielectric structure, silicide/high-K dielectric structure, and combinations thereof.

As mentioned above, CMOSFET is composited by single fin-line FinFET transistors, circular shape contact is used for the drain node of CMOSFET, and rectangular shape contact is used for the source node CMOSFET; and therefore, the semiconductor device (i.e., CMOSFET) of the present disclosure have both lower source node contact resistance as well as low capacitance on drain node so as to meet both high density and high speed SOC product requirements.

Figure 4:
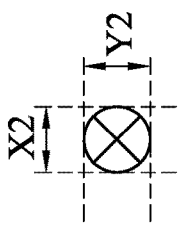
FIG. 4 is a diagram of a contact of the semiconductor device in FIG. 1, in accordance with various embodiments.
Figure 3:
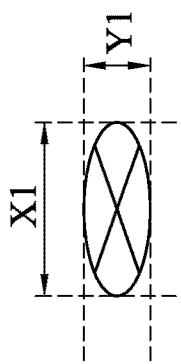
FIG. 3 is a diagram of a contact of the semiconductor device in FIG. 1, in accordance with various embodiments.

Reference is now made to FIGS. 3 and 4. FIGS. 3 and 4 are diagrams of contacts of the semiconductor device in FIG. 1, in accordance with various embodiments. As illustrated in FIG. 3, it shows the ratio of the rectangle. The rectangles of the contacts C2 and C4 include lengths and widths, and the ratio of the length and the width is larger than 3. As illustrated in FIG. 4, it shows the ratio of the circle. The circles of the contacts C1 and C3 include major axis and minor axis, and the ratio of the major axis and the minor axis is less than 1.2. Explain in a different way, the length ratio of longer side and short side of each of the circles of the contacts C1 and C3 is less than 1.2. In some embodiments, the ratio of the major axis and the minor axis is about 0.8 to 1.2. Explain in a different way, the length ratio of longer side and short side of each of the circles of the contacts C1 and C3 is about 0.8 to 1.2. However, the scope of the disclosure is not intended to be limited in the ratio, and other suitable ratio is within the contemplated scope of the present disclosure.

Figure 5:
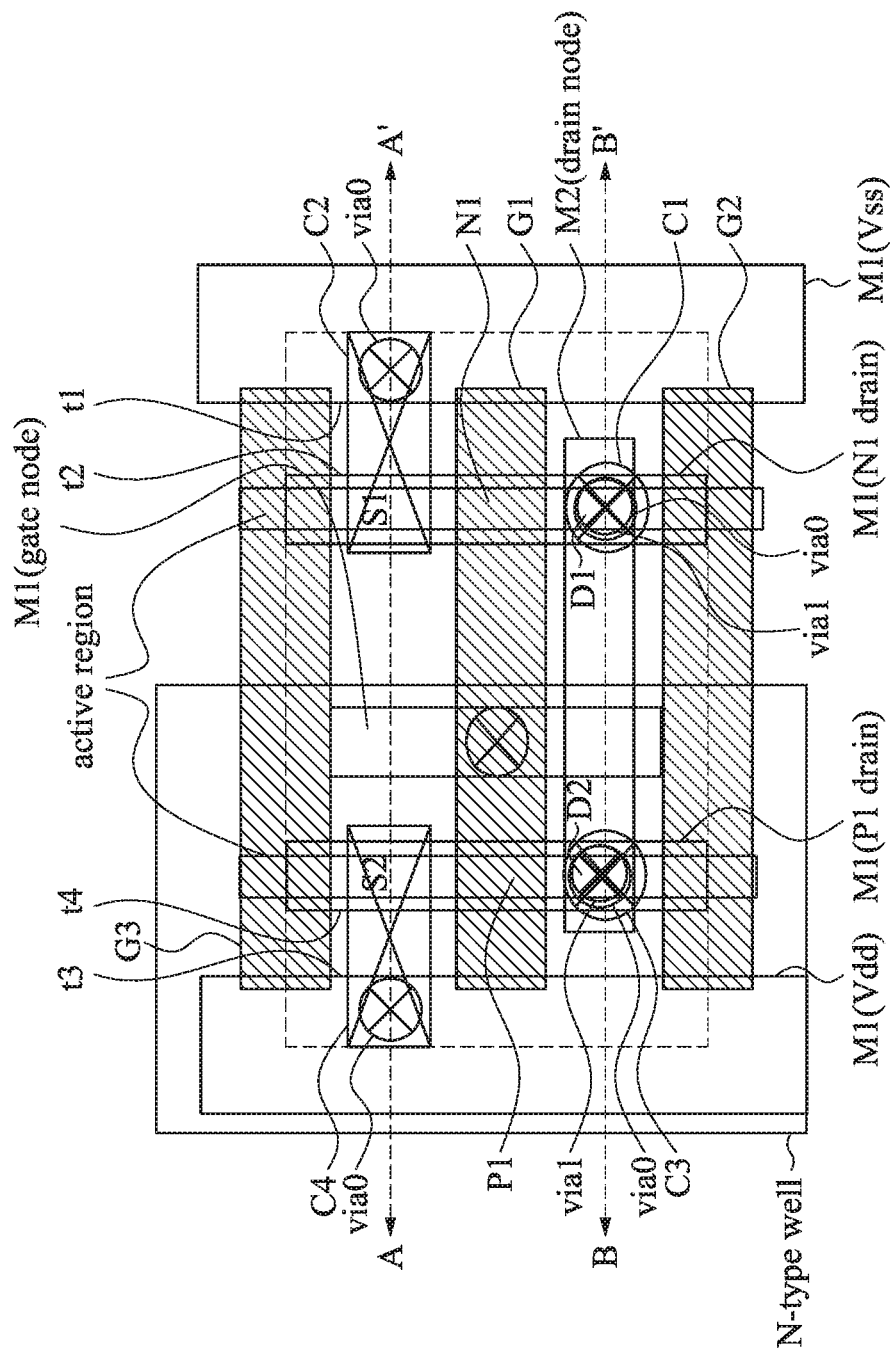
FIG. 5 is a top view of the semiconductor device in FIG. 1, in accordance with various embodiments.
Figure 7:
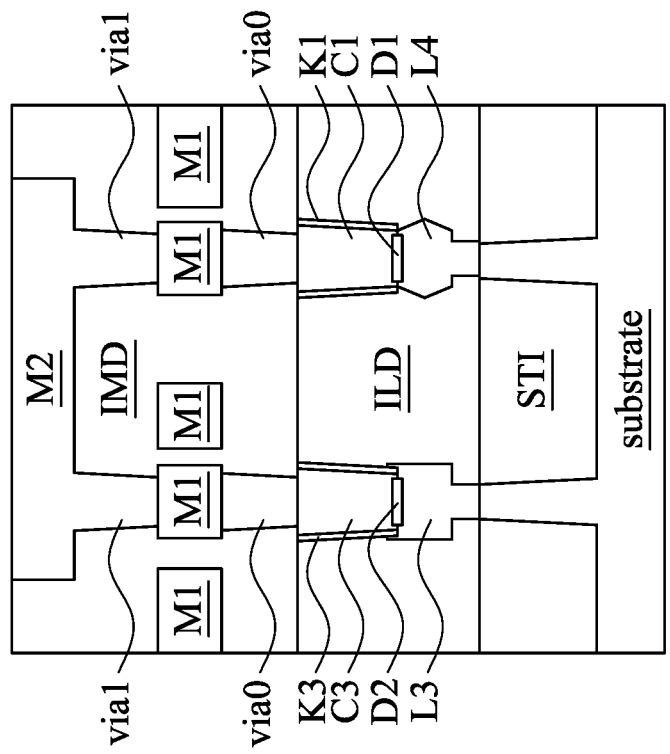
FIG. 7 is a cross-sectional view of the semiconductor device in FIG. 5, in accordance with various embodiments.
Figure 6:
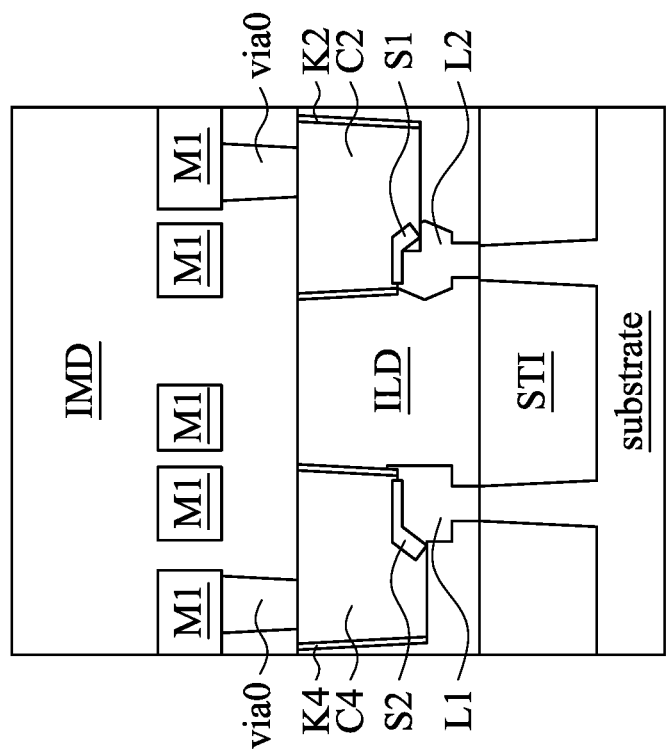
FIG. 6 is a cross-sectional view of the semiconductor device in FIG. 5, in accordance with various embodiments.

Reference is now made to FIG. 5. FIG. 5 is a top view of the semiconductor device in FIG. 1, in accordance with various embodiments. In contrast to the semiconductor device in FIG. 2, the semiconductor device in FIG. 5 further illustrates metal M1 and via 0, 1. For facilitating the understanding of the semiconductor device in FIG. 5, reference is made to both FIGS. 6 and 7. FIG. 6 is a cross-sectional view through line AA' of the semiconductor device in FIG. 5, in accordance with various embodiments. FIG. 7 is a cross-sectional view through line BB' of the semiconductor device in FIG. 5, in accordance with various embodiments.

As illustrated in both FIGS. 5 and 6, the semiconductor device includes a substrate, a shallow trench isolation (STI), a dielectric layer (ILD), a layer L1, a layer L2, a layer S1, a layer S2, a second contact C2, a fourth contact C4, a high-K dielectric layer K2, a high-K dielectric layer K4, via0, metal layers M1(Vss), M1(Vdd), M1(N1 drain), and M1(P1 drain), an inter-metal dielectric (IMD), a gate G1, and dummy gates (or isolation gates) G2, G3. The STI is disposed on the substrate, the ILD is disposed on the STI, and the IMD is disposed on the ILD. The layer L1 and the layer L2 are disposed inside the ILD. The layer S1 is connected between the layer L1 and the fourth contact C4, and the layer S2 is connected between the layer L2 and the second contact C2. The high-K dielectric layer K2 is disposed around the sidewall of the second contact C2, and the high-K dielectric layer K4 is disposed around the sidewall of the fourth contact C4. The high-K dielectric layer K2 is disposed between the second contact C2 and the ILD, and the high-K dielectric layer K4 is disposed between the fourth contact C4 and the ILD. The second contact C2 is connected to the metal layer M1(Vss) which is electrically connect to Vss through the via 0, and the fourth contact C4 is connected to the metal layer M1(Vdd) which is electrically connect to Vdd through the via 0. The metal layers M1(Vss), M1(Vdd), M1(N1 drain), and M1(P1 drain) and the via 0 are disposed inside the IMD. In FIG. 5, the second contact C2 extends past a longitudinal side t1 of the metal layer M1(Vss) and a longitudinal side t2 of the metal layer M1(N1 drain), and the fourth contact C4 extends past a longitudinal side t3 of the metal layer M1(Vdd) and a longitudinal side t4 of the metal layer M1(P1 drain).

In some embodiments, the material of the substrate of the semiconductor device are selected from the group consisting of bulk-Si, SiP, SiGe, SiC, SiPC, Ge, SOI—Si, SOI—SiGe, III-VI material, and combinations thereof. The layer L1 is, for example, a SiGe epi layer, and the layer L2 is, for example, a SiP epi layer. The layers S1 and S2 are, for example, silicide. The second contact C2 and the fourth contact C4 are, for example, multiple metal material composition, and said materials are selected from the group consisting of Ti, TiN, TaN, Co, W, Al, Cu, and combinations thereof. In various embodiments, the thickness of each of the high-K dielectric layers K2 and K4 is about 5 to 30 Å. In some embodiments, the material of each of the high-K dielectric layers K2 and K4 is Si3N4, or nitride-base dielectric. In various embodiments, the material of each of the high-K dielectric layers K2 and K4 is selected from the group consisting of nitride base dielectric, metal oxide dielectric, Hf oxide, Ta oxide, Ti oxide, Zr oxide, Al oxide, and combinations thereof.

As illustrated in both FIGS. 5 and 7, the semiconductor device includes a substrate, a STI, an ILD, a layer L3, a layer L4, a layer S3, a layer S4, a first contact C1, a third contact C3, a high-K dielectric layer K1, a high-K dielectric layer K3, via0, via 1, metal layers M1(N1 drain), and M1(P1 drain), an IMD, a metal layer M2, a gate G1, and dummy gates (or isolation gates) G2, G3. The STI is disposed on the substrate, the ILD is disposed on the STI, and the IMD is disposed on the ILD. The layer L3 and the layer L4 are disposed inside the ILD. The layer S3 is connected between the layer L3 and the third contact C3, and the layer S4 is connected between the layer L4 and the first contact C1. The high-K dielectric layer K1 is disposed around the sidewall of the first contact C1, and the high-K dielectric layer K3 is disposed around the sidewall of the third contact C3. The high-K dielectric layer K1 is disposed between the first contact C1 and the ILD, and the high-K dielectric layer K3 is disposed between the third contact C3 and the ILD. The first contact C1 is connected to the metal layer M1(N1 drain) which is electrically connect to N1 drain through the via 0, and the third contact C3 is connected to the metal layer M1(P1 drain) which is electrically connect to P1 drain through the via 0. The metal layers M1(N1 drain) and M1(P1 drain) and the via 0 are disposed inside the IMD. The metal layer M2 shown in FIG. 7 which is a drain node is connected to the metal layers M1(N1 drain) and M1(P1 drain) through via 1.

In some embodiments, the material of the substrate of the semiconductor device are selected from the group consisting of bulk-Si, SiP, SiGe, SiC, SiPC, Ge, SOI—Si, SOI—SiGe, III-VI material, and combinations thereof. The layer L3 is, for example, a SiGe epi layer, and the layer L4 is, for example, a SiP epi layer. The layers S3 and S4 are, for example, silicide. The first contact C1 and the third contact C3 are, for example, multiple metal material composition, and said materials are selected from the group consisting of Ti, TiN, TaN, Co, W, Al, Cu, and combinations thereof. In various embodiments, the thickness of each of the high-K dielectric layers K1 and K3 is about 5 to 30 Å. In some embodiments, the material of each of the high-K dielectric layers K1 and K3 is Si3N4, or nitride-base dielectric. In various embodiments, the material of each of the high-K dielectric layers K1 and K3 is selected from the group consisting of nitride base dielectric, metal oxide dielectric, Hf oxide, Ta oxide, Ti oxide, Zr oxide, Al oxide, and combinations thereof.

Figure 8:
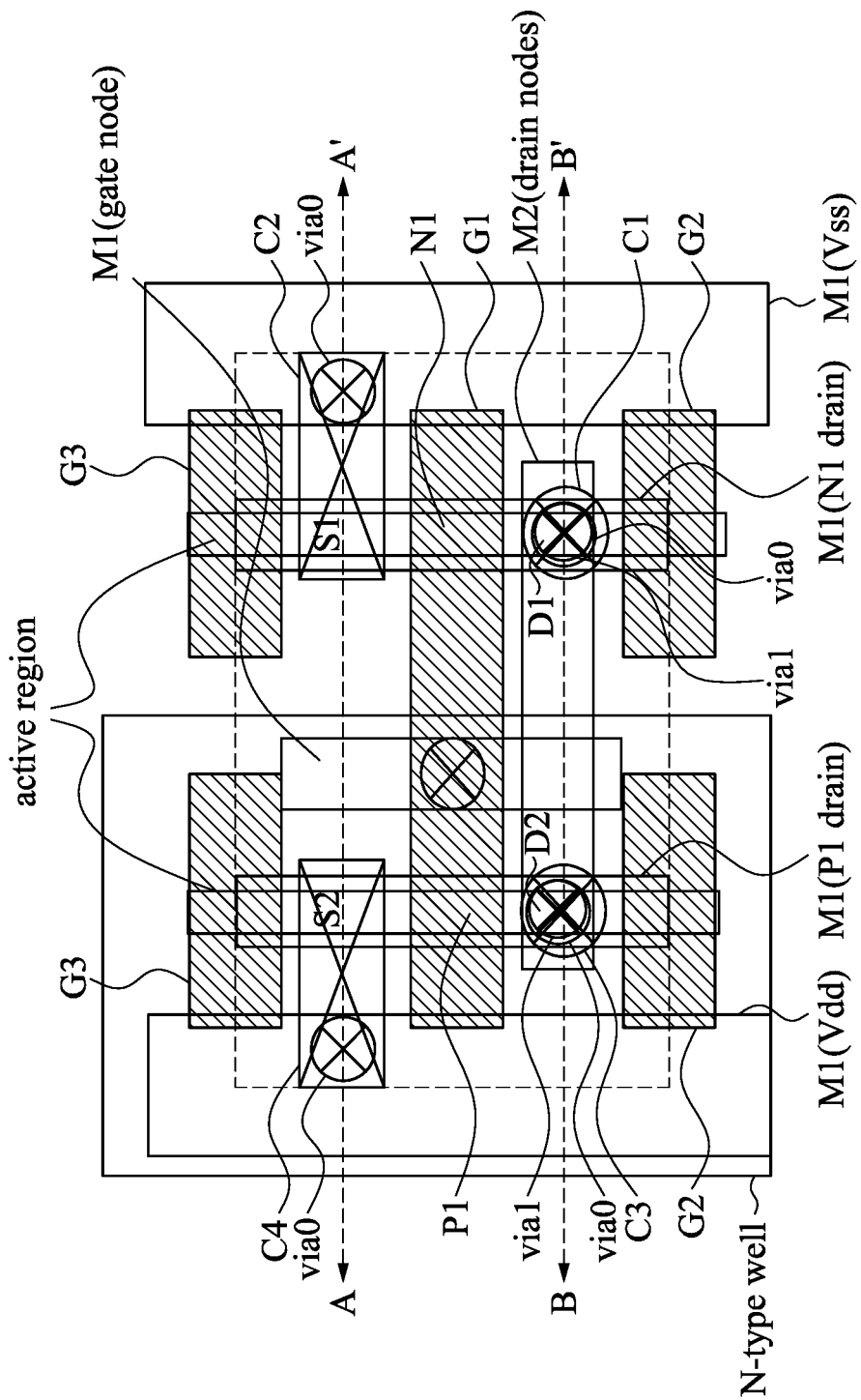
FIG. 8 is a top view of the semiconductor device in FIG. 1, in accordance with various embodiments.

Reference is now made to FIG. 8. FIG. 8 is a top view of the semiconductor device in FIG. 1, in accordance with various embodiments. In contrast to the semiconductor device in FIG. 5, the dummy gates (or isolation gates) G2, G3 of the semiconductor device in FIG. 8 are separated into two portions. Explained in a different way, each of the dummy gates (or isolation gates) G2, G3 has two portions which are not connected to each other.

Figure 9:
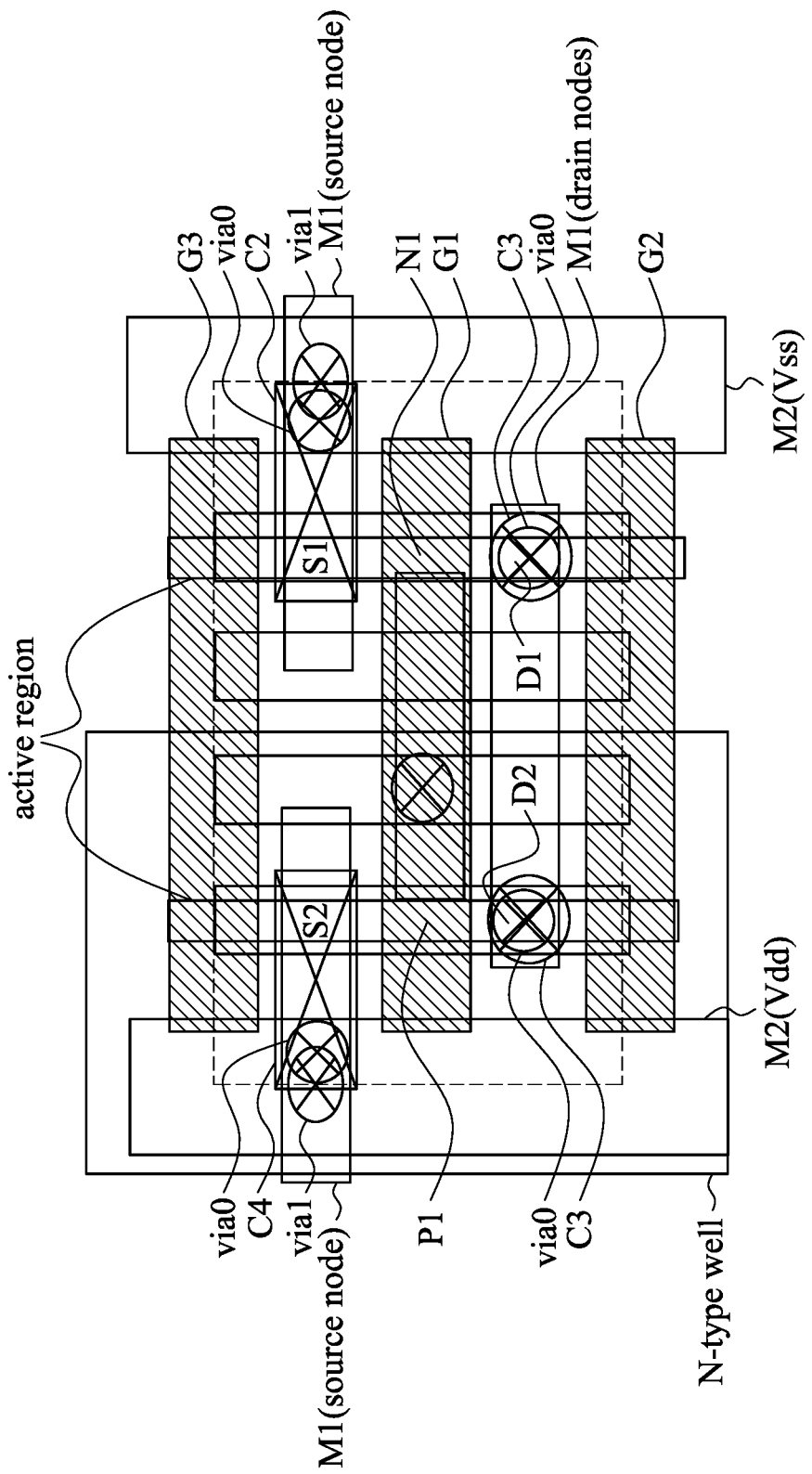
FIG. 9 is a top view of the semiconductor device in FIG. 1, in accordance with various embodiments.

Reference is now made to FIG. 9. FIG. 9 is a top view of the semiconductor device in FIG. 1, in accordance with various embodiments. In contrast to the semiconductor device in FIG. 5, the second terminal S1 of the first transistor N1 is electrically connected to the metal layer M2 which is electrically connected to Vss, and the second terminal S2 of the second transistor P1 is electrically connected to the metal layer M2 which is electrically connect to Vdd. In some embodiments, the second terminal S1 of the first transistors N1 is electrically connected to the metal layer M1 through the via 0, and the metal layer M1 is electrically connected to the metal layer M2 which is electrically connected to Vss through the via 1. The second terminal S2 of the second transistors P1 is electrically connected to the metal layer M1 through the via 0, and the metal layer M1 is electrically connected to the metal layer M2 which is electrically connect to Vdd through the via 1.

Figure 11:
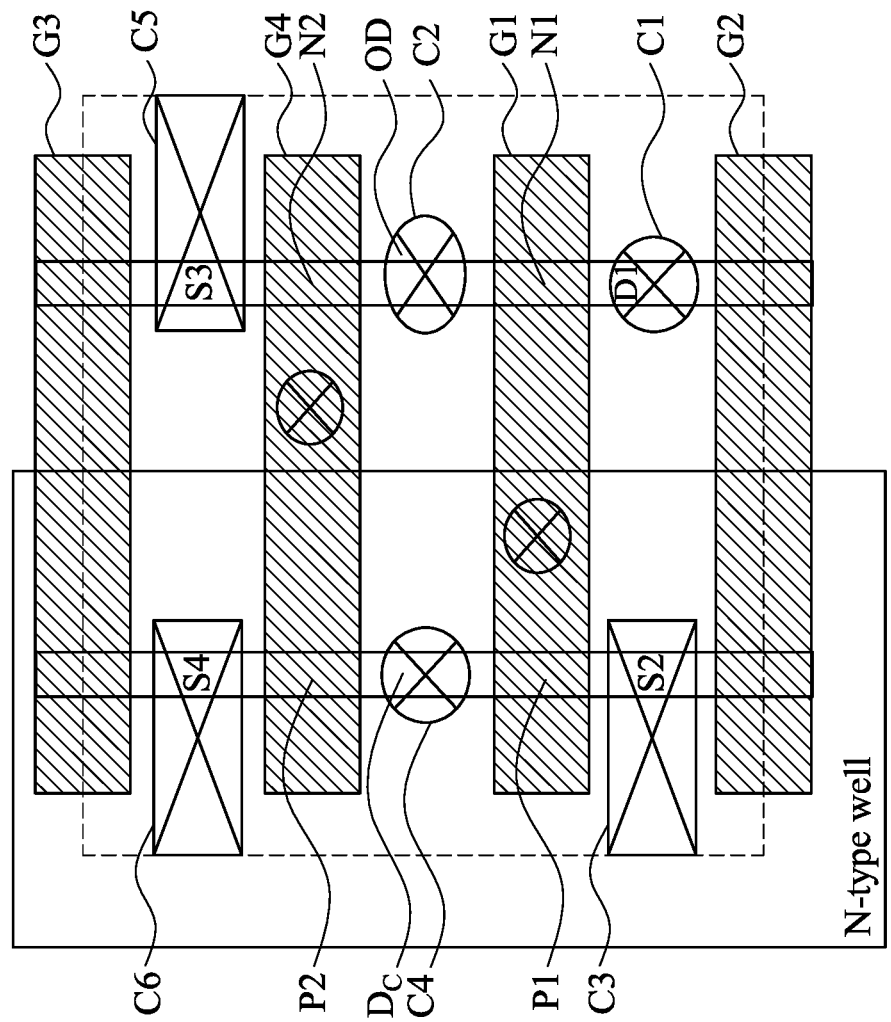
FIG. 11 is a top view of the semiconductor device in FIG. 10, in accordance with various embodiments.
Figure 10:
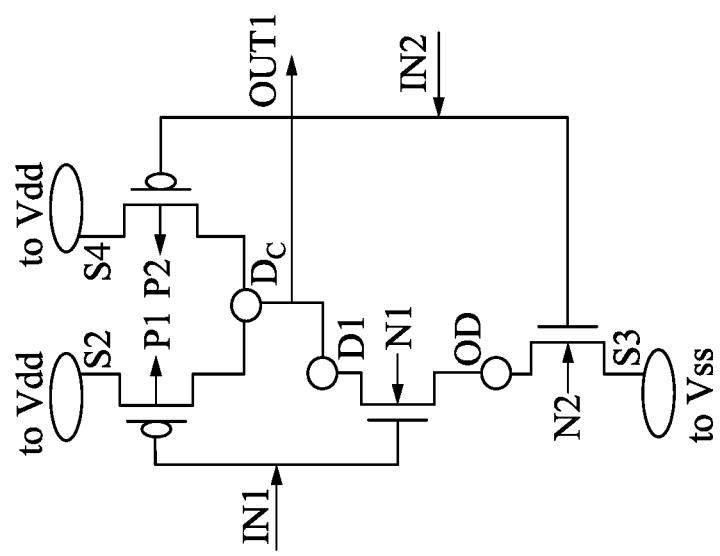
FIG. 10 is a diagram of a semiconductor device, in accordance with various embodiments.

Reference is now made to FIGS. 10 and 11. FIG. 10 is a diagram of a semiconductor device, in accordance with various embodiments. FIG. 11 is a top view of the semiconductor device in FIG. 10, in accordance with various embodiments. In contrast to the semiconductor device in FIG. 1, the semiconductor device in FIGS. 10 and 11 further includes a third transistor P2 and a fourth transistor N2. The third transistor P2 includes a first terminal $D_C$ and a first contact C4, a second terminal S4, and a second contact C6. The fourth transistor N2 includes a first terminal OD and a first contact C2, a second terminal S3, a second contact C5, and a control terminal. The first contact C4 of the third transistor P2 is electrically connected to the first terminal $D_C$ of the second transistor P1 and the first terminal D1 of the first transistor N1, and the shape of the first contact C4 of the third transistor P2 is circular. The second contact C6 of the third transistor P2 is electrically connected to the second terminal S4 and the power source Vdd, and the shape of the second contact C6 is rectangular.

In some embodiments, the first contact C2 of the fourth transistor N2 is electrically connected to the first terminal OD of the fourth transistor N2. The first contact C2 of the fourth transistor N2 is electrically connected to the second terminal OD of the first transistor N1, and the shape of the first contact C2 of the fourth transistor N2 is circular. The second contact C5 of the fourth transistor N2 is electrically connected to the second terminal S3 of the fourth transistor N2 and the ground terminal Vss, and the shape of the second contact C5 is rectangular. The control terminal of the fourth transistor N2 is electrically connected to a control terminal of the third transistor P2. However, the scope of the disclosure is not intended to be limited in the shape of the contacts, and other suitable shapes of the contacts are within the contemplated scope of the present disclosure. In some embodiments, the semiconductor device in FIGS. 10~11 is, for example, a NAND.

In various embodiments, the first contact C4 of the third transistor P2 is directly connected to the first terminal $D_C$ of the second transistor P1 and the first terminal D1 of the first transistor N1. The second contact C6 of the third transistor P2 is directly connected to the second terminal S4 of the third transistor P2, and electrically connected the power source Vdd. In various embodiments, the third transistor P2 and the fourth transistor N2 are, for example, single fin-line fin field effect transistors (FET). The third transistor P2 is, for example, single fin-line P-type FinFET, and the fourth transistor N2 is, for example, single fin-line N-type FinFET. In some embodiments, the first terminal $D_C$ of the third transistor P2 and the first terminal OD of the fourth transistor N2 are drains. The second terminal S4 of the third transistor P2 and the second terminal S3 of the fourth transistor N2 are sources. In some embodiments, the source and the drain of the P-type FinFET P2 comprise epi profile selected from the group consisting of SiGe, SiGeC, Ge, Si, and combinations thereof. In various embodiments, the source and the drain of the N-type FinFET N2 comprises epi profile selected from the group consisting of SiP content, SiC content, SiPC, SiAs, Si, and combinations thereof. In some embodiments, the transistors are FinFET structure and selected from the group consisting of 2D-finFET structure, 3D-finFET structure, and combinations thereof. In various embodiments, the structure of the gate electrodes in FIGS. 10 and 11 comprise multiple material structure selected from the group consisting of poly gate/SiON structure, metals/high-K dielectric structure, Al/refractory metals/high-K dielectric structure, silicide/ high-K dielectric structure, and combinations thereof.

Figure 12:
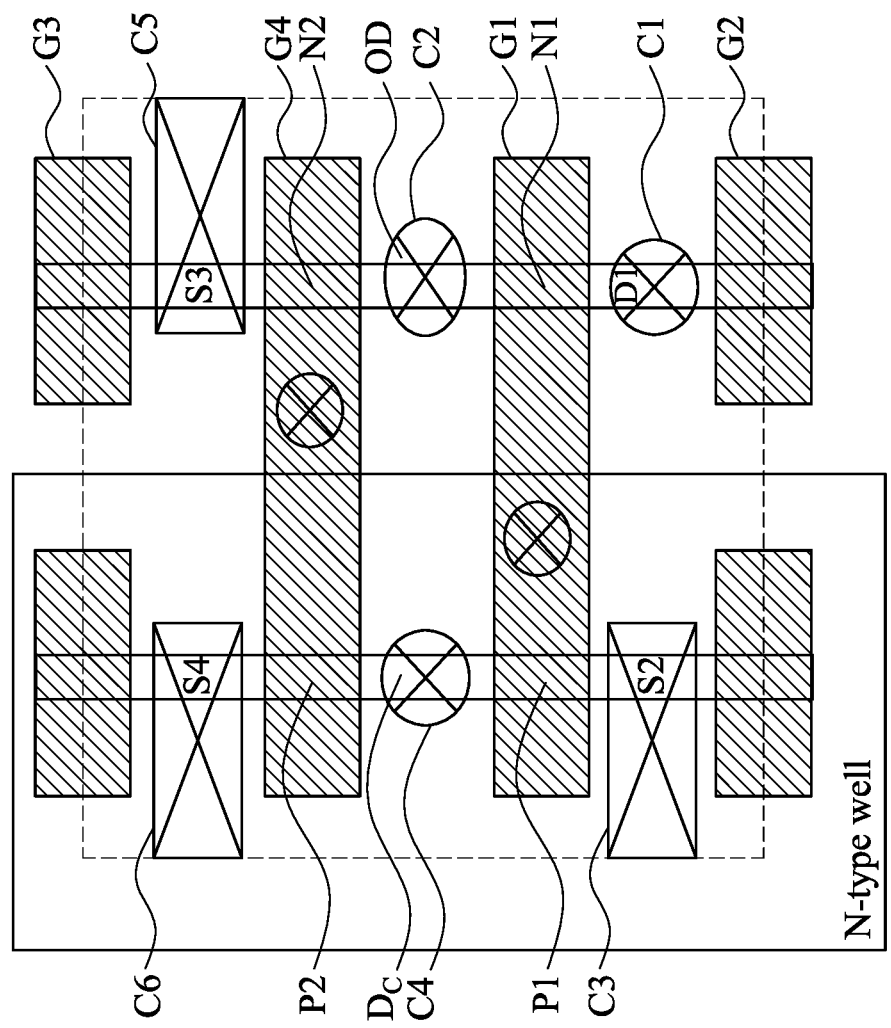
FIG. 12 is a top view of the semiconductor device in FIG. 10, in accordance with various embodiments.

Reference is now made to FIG. 12. FIG. 12 is a top view of the semiconductor device in FIG. 10, in accordance with various embodiments. In contrast to the semiconductor device in FIG. 11, the dummy gates (or isolation gates) G2, G3 of the semiconductor device in FIG. 12 are separated into two portions. Explained in a different way, each of the dummy gates (or isolation gates) G2, G3 has two portions which are not connected to each other.

Figure 14:
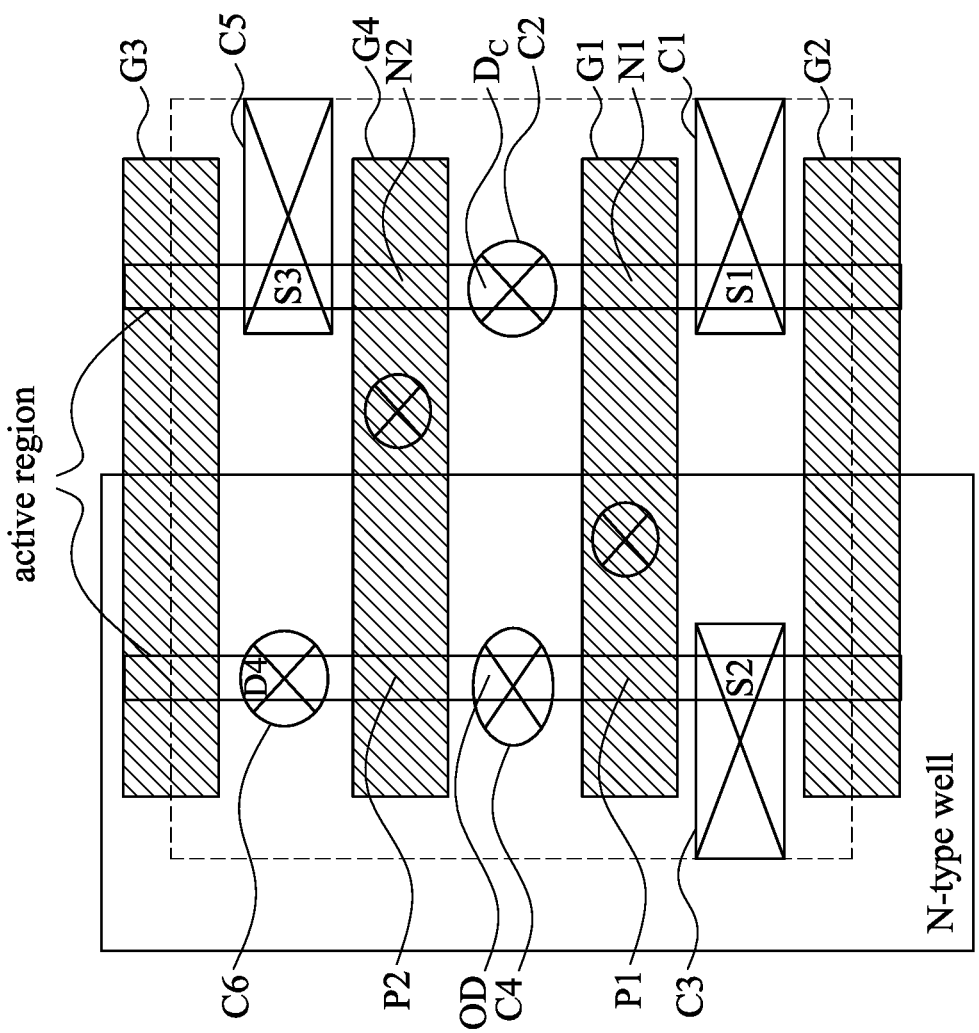
FIG. 14 is a top view of the semiconductor device in FIG. 13, in accordance with various embodiments.
Figure 13:
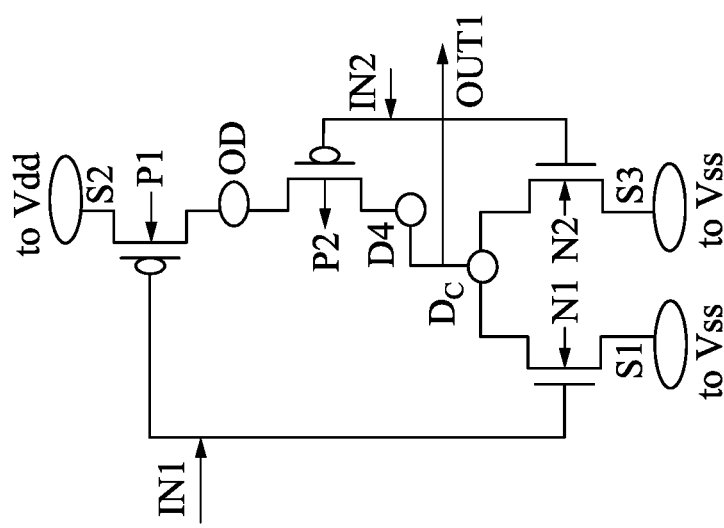
FIG. 13 is a diagram of a semiconductor device, in accordance with various embodiments.

Reference is now made to both FIGS. 13 and 14. FIG. 13 is a diagram of a semiconductor device, in accordance with various embodiments. FIG. 14 is a top view of the semiconductor device in FIG. 13, in accordance with various embodiments. In contrast to the semiconductor device in FIG. 1, the semiconductor device in FIGS. 13 and 14 further includes a third transistor P2 and a fourth transistor N2. The third transistor P2 includes a first terminal D4 and a first contact C6, a second terminal OD, and a second contact C4. The fourth transistor N2 includes a first terminal $D_C$ and a first contact C2, a second terminal S3, a second contact C5, and a control terminal. The first contact C6 of the third transistor P2 is electrically connected to the first terminal D4 of the third transistor P2. The first terminal D4 of the third transistor P2 is electrically connected to the first terminal DC of the first transistor N1, and the shape of the first contact C6 of the third transistor P2 is circular. The second contact C4 of the third transistor P2 is electrically connected to the second terminal OD of the third transistor P2, and the second contact C4 of the third transistor P2 is electrically connected to the first terminal OD of the second transistor P1, and the shape of the second contact C4 of the third transistor P2 is rectangular.

In some embodiments, the first contact C2 of the fourth transistor N2 is electrically connected to the first terminal $D_C$ of the fourth transistor N2. The first contact C2 of the fourth transistor N2 is electrically connected to the first terminal $D_C$ of the first transistor N1, and the shape of the first contact C2 of the fourth transistor N2 is circular. The second contact C5 of the fourth transistor N2 is electrically connected to the second terminal S3 of fourth transistor N2 and the ground terminal Vss, and the shape of the second contact C5 is rectangular. The control terminal of the fourth transistor N2 is electrically connected to a control terminal of the third transistor P2. However, the scope of the disclosure is not intended to be limited in the shape of the contacts, and other suitable shapes of the contacts are within the contemplated scope of the present disclosure. In some embodiments, the semiconductor device in FIGS. 13~14 is, for example, a NOR.

In various embodiments, the second contact C4 of the third transistor P2 is directly connected to the second terminal OD of the third transistor P2, and the second contact C4 of the third transistor P2 is directly connected to the first terminal OD of the second transistor P1. The first contact C2 of the fourth transistor N2 is directly connected to the first terminal $D_C$ of the fourth transistor N2, and the first contact C2 of the fourth transistor N2 is directly connected to the first terminal $D_C$ of the first transistor N1. The second contact C5 of the fourth transistor N2 is directly connected to the second terminal S3 of fourth transistor N2, and electrically connected the ground terminal Vss. In various embodiments, the third transistor P2 and the fourth transistor N2 are, for example, single fin-line fin field effect transistors (FET). The third transistor P2 is, for example, single fin-line P-type FinFET, and the fourth transistor N2 is, for example, single fin-line N-type FinFET. In some embodiments, the first terminal D4 of the third transistor P2 and the first terminal $D_C$ of the fourth transistor N2 are drains. The second terminal OD of the third transistor P2 and the second terminal S3 of the fourth transistor N2 are sources. In some embodiments, the source and the drain of the P-type FinFET P2 comprise epi profile selected from the group consisting of SiGe, SiGeC, Ge, Si, and combinations thereof. In various embodiments, the source and the drain of the N-type FinFET N2 comprises epi profile selected from the group consisting of SiP content, SiC content, SiPC, SiAs, Si, and combinations thereof. In some embodiments, the transistors are FinFET structure and selected from the group consisting of 2D-finFET structure, 3D-finFET structure, and combinations thereof. In various embodiments, the structure of the gate electrodes in FIGS. 13 and 14 comprise multiple material structure selected from the group consisting of poly gate/SiON structure, metals/high-K dielectric structure, Al/refractory metals/high-K dielectric structure, silicide/ high-K dielectric structure, and combinations thereof.

Figure 15:
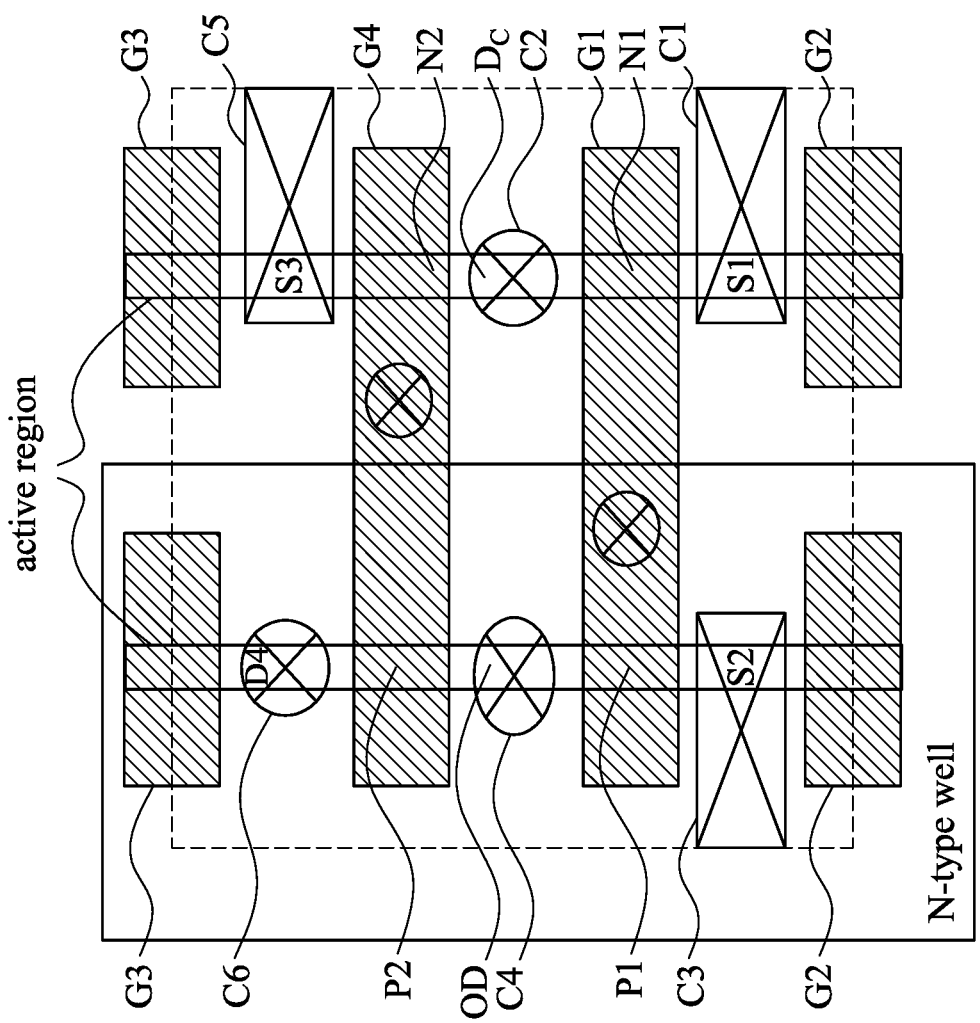
FIG. 15 is a top view of the semiconductor device in FIG. 13, in accordance with various embodiments.

Reference is now made to FIG. 15. FIG. 15 is a top view of the semiconductor device in FIG. 13, in accordance with various embodiments. In contrast to the semiconductor device in FIG. 14, the dummy gates (or isolation gates) G2, G3 of the semiconductor device in FIG. 15 are separated into two portions. Explained in a different way, each of the dummy gates (or isolation gates) G2, G3 has two portions which are not connected to each other.

Figure 17:
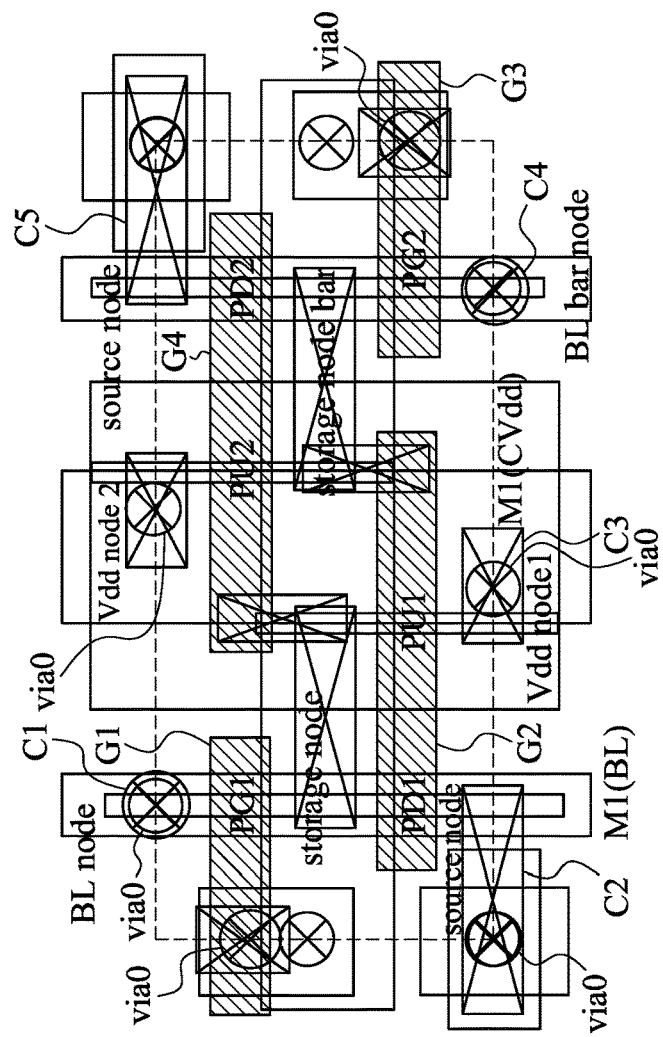
FIG. 17 is a top view of the semiconductor device in FIG. 16, in accordance with various embodiments.
Figure 16:
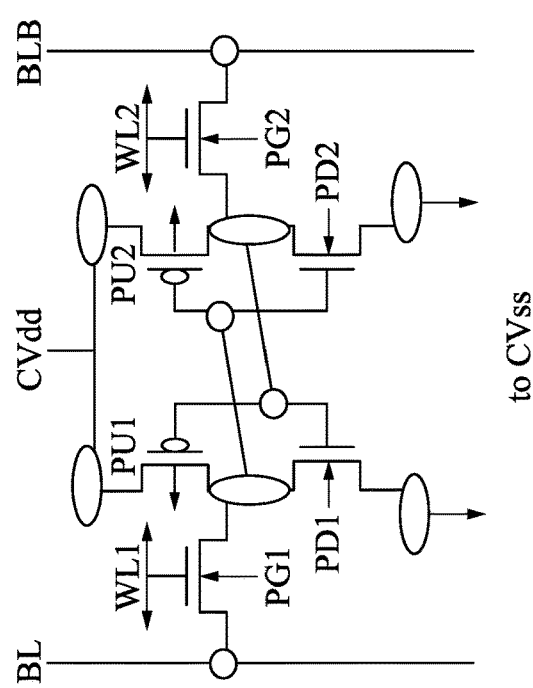
FIG. 16 is a diagram of a semiconductor device, in accordance with various embodiments.

Reference is now made to FIGS. 16 and 17. FIG. 16 is a diagram of a semiconductor device, in accordance with various embodiments. FIG. 17 is a top view of the semiconductor device in FIG. 16, in accordance with various embodiments. As illustrated in both FIGS. 16 and 17, the semiconductor device includes a first transistor PG1 and a second transistor PD1. The first transistor PG1 includes a first terminal, a first contact C1, a second terminal, and a control terminal. The second transistor PD1 includes a first terminal, a second terminal, a second contact C2. The first contact C1 of the first transistor PG1 is electrically connected to the first terminal of the first transistor PG1 and a first bit line BL, and the shape of the first contact C1 is circular. The control terminal of the first transistor PG1 is electrically connected to a first word line WL1. The circle of the first contact C1 of the first transistor PG1 includes major axis and minor axis, and the ratio of the major axis and the minor axis is less than 1.2.

In various embodiments, the first terminal of the second transistor PD1 is electrically connected to the second terminal of the first transistor PG1. The second contact C2 of the second transistor PD1 is electrically connected to the second terminal of the second transistor PD1 and a ground terminal CVss, and the shape of the second contact C2 is rectangular. In some embodiments, the rectangle of the second contact C2 of the second transistor PD1 includes lengths and widths, and the ratio of the length and the width is larger than 3.

In some embodiments, the semiconductor device further includes a third transistor PU1. The third transistor PU1 includes a first terminal, a second terminal, a second contact C3, and a control terminal. The first terminal of the third transistor PU1 is electrically connected to a power source CVdd. The second contact C3 of the third transistor PU1 is electrically connected to the second terminal of the third transistor PU1 and a power source CVdd, and the shape of the second contact C3 is rectangular. The control terminal of the third transistor PU1 is electrically connected to a control terminal of the second transistor PD1. The rectangle of the second contact C3 of the third transistor PU1 includes lengths and widths, and the ratio of the length and the width is larger than 2.

As illustrated in both FIGS. 16 and 17, the semiconductor device further includes a fourth transistor PG2 and a fifth transistor PD2. The fourth transistor PG2 includes a first terminal, a first contact C4, a second terminal, and a control terminal. The fifth transistor PD2 includes a first terminal, a second terminal, and a second contact C5. The first contact C4 of the fourth transistor PG2 is electrically connected to the first terminal of the fourth transistor PG2 and a second bit line BLB, and the shape of the first contact C4 is circular. The control terminal of the fourth transistor PG2 is electrically connected to a second word line WL2. The circle of the first contact C4 of the fourth transistor PG2 includes major axis and minor axis, and the ratio of the major axis and the minor axis is less than 1.2.

In various embodiments, the first terminal of the fifth transistor PD2 is electrically connected to the second terminal of the fourth transistor PG2. The second contact C5 of the fifth transistor PD2 is electrically connected to the second terminal of the fifth transistor PD2 and the ground terminal CVss, and the shape of the second contact C5 is rectangular. In some embodiments, the rectangle of the second contact C5 of the fifth transistor PD2 includes lengths and widths, and the ratio of the length and the width is larger than 3.

In various embodiments, the semiconductor device further includes a sixth transistor PU2. The sixth transistor PU2 includes a first terminal, a second terminal, and a control terminal. The first terminal of the sixth transistor PU2 is electrically connected to the power source CVdd. The second terminal of the sixth transistor PU2 is electrically connected to the first terminal of the fifth transistor PD2, the second terminal of the fourth transistor PG2, and the control terminal of the third transistor PU1. The control terminal of the sixth transistor PU2 is electrically connected to a control terminal of the fifth transistor PD2 and the second terminal of the third transistor PU1. In various embodiments, the transistors PG1, PD1, PU1, PG2, PD2, PU2 are, for example, single fin-line fin field effect transistors (FET). In some embodiments, the semiconductor device in FIGS. 16~17 is, for example, a SRAM.

In some embodiments, a semiconductor device is disclosed that includes a first terminal, a first contact, a second terminal, and a second contact. The first contact is electrically connected to the first terminal, and the shape of the first contact is circular. The second contact is electrically connected to the second terminal and a ground terminal, and the shape of the second contact is rectangular.

Also disclosed is a semiconductor device that includes a first N-type fin field effect transistor (FinFET). The first N-type FinFET includes a drain, a first contact, a first high-K dielectric layer, a source, a second contact, and a second high-K dielectric layer. The first contact is directly connected to the drain, and the shape of the first contact includes circular. The first high-K dielectric layer is disposed around a sidewall of the first contact. The second contact is directly connected to the source and electrically connected to a ground terminal, and the shape of the second contact includes rectangular. The second high-K dielectric layer is disposed around a sidewall of the second contact.

Also disclosed is a semiconductor device that includes a first transistor and a second transistor. The first transistor includes a first terminal, a first contact, a second terminal, and a control terminal. The second transistor includes a first terminal, a second terminal, and a second contact. The first contact of the first transistor is electrically connected to the first terminal and a first bit line, and the shape of the first contact includes circular. The control terminal of the first transistor is electrically connected to a first word line. The first terminal of the second transistor is electrically connected to the second terminal of the first transistor. The second contact of the second transistor is electrically connected to the second terminal of the second transistor and a ground terminal, and the shape of the second contact includes rectangular.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a first fin extending in a first direction and having a first source and a first drain;
   a gate extending a second direction perpendicular to the first direction, wherein the first source and the first drain are respectively on opposite sides of the gate when viewed from above;
   a first source contact in contact with the first source and laterally extending beyond a longitudinal end of the gate when viewed in a first cross-section taken along the second direction; and
   a first drain contact in contact with the first drain when viewed in a second cross-section taken along the second direction, wherein when viewed from above, the first source contact forms a first rectangular pattern and the first drain contact forms a first circular pattern.

2. The semiconductor device of claim 1, wherein the first source contact is in direct contact with the first source, and the first drain contact is in direct contact with the first drain.

3. The semiconductor device of claim 1, wherein the first circular pattern of the first drain contact has a major axis and a minor axis, and a ratio of the major axis and the minor axis of the first circular pattern is about 0.8 to 1.2, and the first rectangular pattern of the first source contact has a length and a width, and a ratio of the length and the width of the first rectangular pattern is larger than 3.

4. The semiconductor device of claim 1, further comprising:
   a second fin extending in the first direction and having a second source and a second drain, wherein the second source and the second drain are respectively on the opposite sides of the gate when viewed from above;
   a second source contact in contact with the second source when viewed in the first cross-section; and
   a second drain contact in contact with the second drain viewed in the second cross-section, wherein when viewed from above the second source contact forms a second rectangular pattern and the first drain contact forms a second circular pattern.

5. The semiconductor device of claim 4, wherein the second source contact is in direct contact with the second source, and the second drain contact is in direct contact with the second drain.

6. The semiconductor device of claim 4, wherein the second circular pattern of the second drain contact has a major axis and a minor axis, and a ratio of the major axis and the minor axis of the second circular pattern is about 0.8 to 1.2, and the second rectangular pattern of the second source contact has a length and a width, and a ratio of the length and the width of the second rectangular pattern is larger than 3.

7. The semiconductor device of claim 1, further comprising a source via landing on the first source contact and does not overlap the first fin when viewed from above.

8. The semiconductor device of claim 7, further comprising a conductive line in contact with the source via, wherein when viewed from above the first source contact is across opposite edges of the conductive line.

9. The semiconductor device of claim 7, further comprising a conductive line in contact with the source via, wherein when viewed from above a length of a top surface of the first source contact measured in a lengthwise direction of the gate is greater than a length of a top surface of the conductive line measured in the lengthwise direction of the gate.

10. A semiconductor device, comprising:
   a first fin extending in a first direction and having a first source and a first drain;
   a gate extending a second direction perpendicular to the first direction, wherein the first source and the first drain are respectively on opposite sides of the gate when viewed from above;
   a first drain contact in contact with the first drain when viewed in a cross-section taken along the second direction;
   a drain via in contact with the first drain contact when viewed in the cross-section taken along the second direction, wherein when viewed from above, the first drain contact and the drain via form first and second circular patterns overlapping at the first drain of the first fin;
   a first metal line in contact with the drain via and extending in the first direction;
   a first source contact directly connected to the first source and electrically connected to a ground terminal, wherein when viewed from above the first source contact forms a first rectangular pattern;
   a source via in contact with the first source contact; and
   a second metal line in contact with the source via and extending in the first direction, wherein the first source contact extending past a longitudinal side of the first metal line and a longitudinal side of the second metal line from a top view.

11. The semiconductor device of claim 10, wherein the first fin, the gate, the first source, and the first drain are of an N-type single fin-line fin field effect transistor.

12. The semiconductor device of claim 10, wherein the first circular pattern of the first drain contact has a major axis and a minor axis, and a ratio of the major axis and the minor axis of the first circular pattern is about 0.8 to 1.2, and the first rectangular pattern of the first source contact has a length and a width, and a ratio of the length and the width of the first rectangular pattern is larger than 3.

13. The semiconductor device of claim 10, further comprising:
   a second fin extending in the first direction and having a second source and a second drain, wherein the second source and the second drain are respectively on the opposite sides of the gate when viewed from above; and
   a second source contact and a second drain contact in direct contact with the source and the drain when viewed in a cross-section taken along the second direction, wherein when viewed from above the second source contact forms a second rectangular pattern and the first drain contact forms a third circular pattern and the second source contact is connected to a power source.

14. The semiconductor device of claim 13, wherein the second fin, the gate, the second source, and the second drain are of a P-type FinFET.

15. The semiconductor device of claim 13, wherein the third circular pattern of the second drain contact has a major axis and a minor axis, and a ratio of the major axis and the minor axis of the third circular pattern is about 0.8 to 1.2, and the second rectangular pattern of the second source contact has a length and a width, and a ratio of the length and the width of the second rectangular pattern is larger than 3.

16. The semiconductor device of claim 10, wherein when viewed from above, an area of a top surface of the first source contact is greater than an area of a top surface of the first drain contact.

17. The semiconductor device of claim 10, wherein when viewed from above, a length of a top surface of the first source contact measured in a lengthwise direction of the gate is greater than a length of a top surface of the first drain contact measured in the lengthwise direction of the gate.

18. A semiconductor device, comprising:
   a fin extending in a first direction and having a source and a drain;
   a gate extending a second direction perpendicular to the first direction, wherein the source and the drain are respectively on opposite sides of the gate when viewed from above;
   a source contact and a drain contact respectively overlapping the source and the drain of the fin, wherein when viewed from above the source contact has a rectangular top surface, and the drain contact has a circular top surface, and the rectangular top surface of the source contact is on the same level with the circular top surface of the drain contact when viewed in a cross section taken along the second direction; and
   first and second high-k dielectric layers respectively laterally surrounding the source and drain contacts.

19. The semiconductor device of claim 18, wherein a width of the drain contact is smaller than a width the source contact.

20. The semiconductor device of claim 18, wherein the first high-k dielectric layer and the second high-k dielectric layer have different heights.

* * * * *